(12) United States Patent
Chen et al.

(10) Patent No.: US 11,257,433 B2
(45) Date of Patent: Feb. 22, 2022

(54) DISPLAY PANEL AND DRIVING METHOD THEREOF

(71) Applicant: BOE TECHNOLOGY GROUP CO., LTD., Beijing (CN)

(72) Inventors: Jiangbo Chen, Beijing (CN); Hongda Sun, Beijing (CN); Youngsuk Song, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 349 days.

(21) Appl. No.: 16/490,720

(22) PCT Filed: Jan. 7, 2019

(86) PCT No.: PCT/CN2019/070651
§ 371 (c)(1),
(2) Date: Sep. 3, 2019

(87) PCT Pub. No.: WO2020/042522
PCT Pub. Date: Mar. 5, 2020

(65) Prior Publication Data
US 2021/0327354 A1    Oct. 21, 2021

(30) Foreign Application Priority Data

Aug. 30, 2018    (CN) .......................... 201811004718.2

(51) Int. Cl.
*G09G 5/02* (2006.01)
*G09G 3/3258* (2016.01)
(Continued)

(52) U.S. Cl.
CPC ........... *G09G 3/3258* (2013.01); *G09G 3/006* (2013.01); *H01L 27/322* (2013.01);
(Continued)

(58) Field of Classification Search
CPC ..... G09G 2300/0426; G09G 2300/043; G09G 2300/0819; G09G 2300/0842;
(Continued)

(56) References Cited

U.S. PATENT DOCUMENTS

2004/0070558 A1    4/2004    Cok et al.
2006/0022907 A1    2/2006    Uchino et al.
(Continued)

FOREIGN PATENT DOCUMENTS

CN    1722207 A    1/2006
CN    102915713 A    2/2013
(Continued)

OTHER PUBLICATIONS

Translation of International Search Report dated May 30, 2019, issued in counterpart Application No. PCT/CN2019/070651. (5 pages).

*Primary Examiner* — Insa Sadio
(74) *Attorney, Agent, or Firm* — Westerman, Hattori, Daniels & Adrian, LLP (57) ABSTRACT

Provided are a display panel (10) and the driving method thereof. The display panel (10) may include a first substrate (110) and a second substrate (120) opposite the first substrate (110). The first substrate (110) may include a pixel unit (100), and the pixel unit (100) may include a light emitting element (101) and a first transistor (112) for driving the light emitting element (101) to emit light. The second substrate (120) may include a second transistor (122). The second transistor (122) may be configured to have a second drift value of a second threshold voltage which has a specific relationship with a first drift value of a first threshold voltage of the first transistor (112) under same ambient condition.

20 Claims, 8 Drawing Sheets (51) Int. Cl.
  *G09G 3/00* (2006.01)
  *H01L 27/32* (2006.01)
(52) U.S. Cl.
  CPC ...... *H01L 27/3253* (2013.01); *H01L 27/3262* (2013.01); *H01L 27/3272* (2013.01); *G09G 2320/0233* (2013.01); *G09G 2320/041* (2013.01); *G09G 2320/045* (2013.01)
(58) Field of Classification Search
  CPC ... G09G 2300/0861; G09G 2310/0251; G09G 3/3233; G09G 3/3258; G09G 3/3266; G09G 3/3659
  See application file for complete search history.

(56) References Cited

U.S. PATENT DOCUMENTS

| | | | | |
|---|---|---|---|---|
| 2008/0062106 A1* | 3/2008 | Tseng | ................... | G09G 3/3677 345/92 |
| 2015/0154908 A1* | 6/2015 | Nam | .................... | G09G 3/3233 345/76 |
| 2018/0357960 A1 | 12/2018 | Yang et al. | | |

FOREIGN PATENT DOCUMENTS

| | | | |
|---|---|---|---|
| CN | 104700772 | A | 6/2015 |
| CN | 105243994 | A | 1/2016 |
| CN | 107657923 | A | 2/2018 |
| CN | 107731156 | A | 2/2018 |
| CN | 108417169 | A | 8/2018 |
| WO | 2004088626 | A1 | 10/2004 |

* cited by examiner

DISPLAY PANEL AND DRIVING METHOD THEREOF

CROSS-REFERENCE TO RELATED APPLICATIONS

This application claims benefit of the filing date of Chinese Patent Application No. 201811004718.2 filed on Aug. 30, 2018, the disclosure of which is hereby incorporated in its entirety by reference.

TECHNICAL FIELD

The embodiment of the disclosure relates to display technology, in particular, to a display panel and a driving method thereof.

BACKGROUND

In a field of display technology, an organic light-emitting diode (OLED) display panel has advantageous characteristics such as self-luminescence, high contrast, low energy consumption, wide viewing angle, fast response, flexible panel, wide temperature range, simple manufacturing, etc. The OLED display panel has broad prospects for development. In an OLED display panel, a thin film transistor which connects with OLED and drives the OLED is usually called a driving transistor. Stability of a threshold voltage of the driving transistor has an important effect on the display quality of the OLED display panel.

BRIEF SUMMARY

An example of the present disclosure provides a display panel. The display panel may include a first substrate and a second substrate opposite the first substrate. The first substrate may include a pixel unit, and the pixel unit may include a light emitting element and a first transistor for driving the light emitting element to emit light. The second substrate may include a second transistor. The second transistor may be configured to have a second drift value of a second threshold voltage which has a specific relationship with a first drift value of a first threshold voltage of the first transistor under same ambient condition.

Optionally, the first drift value of the first threshold voltage of the first transistor caused by a temperature is substantially the same as the second drift value of the second threshold voltage of the second transistor caused by the temperature.

Optionally, the second transistor is substantially identical in structure and material as the first transistor, and the specific relationship is that the second drift value is proportional to the first drift value.

Optionally, active layers of the first transistor and the second transistor have the same size and are made of the same material, and the specific relationship is that the second drift value is the same as the first drift value.

Optionally, doped regions of the active layers of the first transistor and the second transistor have the same size and doping concentration.

Optionally, channel regions of the active layers of the first transistor and the second transistor have the same aspect ratio.

Optionally, an orthographic projection of the second transistor on the first substrate substantially overlaps an orthographic projection of the first transistor on the first substrate.

Optionally, the pixel unit comprises a plurality of pixel units, the plurality of pixel units comprising a plurality of first transistors. The second substrate comprises a plurality of second transistors, and the plurality of second transistors is in one-to-one correspondence with the plurality of first transistors.

Optionally, the pixel unit comprises a plurality of pixel units, the plurality of pixel units comprising a plurality of first transistors. The second substrate comprises a plurality of second transistors, and each of the plurality of second transistors corresponds to two or more of the plurality of first transistors.

Optionally, the second substrate further comprises a detection circuit coupled to the second transistor, and the detection circuit is configured to detect the second threshold voltage of the second transistor.

Optionally, the detecting circuit comprises a third transistor, a fourth transistor, and a first capacitor. A gate and a first terminal of the third transistor are configured to respectively receive a first scan signal and a data signal, and a second terminal of the third transistor is coupled to a gate of the second transistor; a first terminal and a second terminal of the second transistor are respectively coupled to a first power voltage and a first terminal of the fourth transistor; a gate and a second terminal of the fourth transistor are respectively configured to receive a second scan signal and a detection signal respectively; and the first capacitor is coupled between the gate and the second terminal of the second transistor.

Optionally, the second substrate may further include a light shielding layer, and the light shielding layer is configured to shield the second transistor from external ambient light.

Optionally, the first substrate and the second substrate respectively comprise a first color filter layer and a second color filter layer; the first color filter layer is in an area between first black matrix covering the first transistor; and the second color filter layer is in an area between second black matrix covering the second transistor.

Optionally, an orthogonal projection of the first color filter layer and that of the second color filter layer on a first base substrate respectively substantially overlap with an orthographic projection of the light-emitting element on the first base substrate.

Optionally, the display panel is an organic light emitting diode display panel.

Another example of the present disclosure is a method of driving the display panel. The method of driving the display panel may include compensating for the first threshold voltage of the first transistor by detecting the second threshold voltage of the second transistor.

Optionally, the driving method further includes establishing a specific relationship between a threshold voltage compensation value of the second transistor and a threshold voltage compensation value of the first transistor.

Optionally, compensating for the threshold voltage of the first transistor by detecting the threshold voltage of the second transistor comprises compensating for the threshold voltage of the first transistor by using the specific relationship and the detected threshold voltage of the second transistor.

Optionally, the threshold voltage compensation value of the second transistor is substantially equal to the threshold voltage compensation value of the first transistor.

Optionally, the driving method further includes obtaining a real-time temperature by detecting the threshold voltage of the second transistor. Compensating for the threshold voltage of the first transistor by detecting the threshold voltage of the second transistor comprises compensating for the threshold voltage of the first transistor based on the real-time temperature.

Optionally, obtaining the real-time temperature by detecting the threshold voltage of the second transistor comprises obtaining a temperature-threshold voltage relationship curve of the second transistor, acquiring the real-time temperature by detecting the threshold voltage of the second transistor and consulting with the temperature-threshold voltage relationship curve of the second transistor.

Optionally, compensating for the threshold voltage of the first transistor based on the real-time temperature comprises obtaining a temperature-threshold voltage relationship curve of the first transistor, and acquiring the threshold voltage compensation value of the first transistor by using the real-time temperature and consulting with the temperature-threshold voltage relationship curve of the first transistor.

BRIEF DESCRIPTION OF THE DRAWINGS

In order to more clearly illustrate the technical scheme of embodiments of the present invention, a brief introduction will be given below to the drawings to be used in the description of embodiments or related technologies. Obviously, the drawings described below relate only to some embodiments of the present disclosure and are not limitations to the present invention.

DETAILED DESCRIPTION

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-6C. When referring to the figures, like structures and elements shown throughout are indicated with like reference numerals.

It should be noted that the features shown in the figure do not have to be drawn proportionally. The present disclosure omits the description of known materials, components and process technology, so as not to obscure the exemplary embodiments of the present disclosure. The examples given are only intended to facilitate understanding of the implementation of the exemplary embodiments of the present disclosure and further enable those skilled in the art to implement the exemplary embodiments. Consequently, these examples should not be construed as limiting the scope of embodiments of the present invention.

Unless otherwise specifically defined, the technical or scientific terms used in the present disclosure shall be of general significance to those with general skills in the field to which the disclosure belongs. The words "first," "second," and similar expressions used in the present disclosure do not indicate any order, quantity or importance, but are used to distinguish different components. In addition, in various embodiments of the invention, the same or similar reference labels represent the same or similar components.

A pixel circuit of an OLED display apparatus in the related art usually includes several pixel units arranged in an array. Each pixel unit contains an organic light-emitting element, namely an OLED component and a driving transistor. The pixel circuit is configured to drive the OLED to emit light of predetermined intensity based on data signals. The pixel circuit usually includes a 2T1C pixel circuit, which uses two TFTs and one storage capacitor Cs to realize basic function of driving the OLED to emit light. One TFT may be a switching transistor, which mainly plays a switching function and controls transmission of the data signals. The other TFT may be a driving transistor, which mainly plays a driving function and provides driving current for the pixel electrodes such as cathode or anode of the OLED apparatus.

Figure 1A:
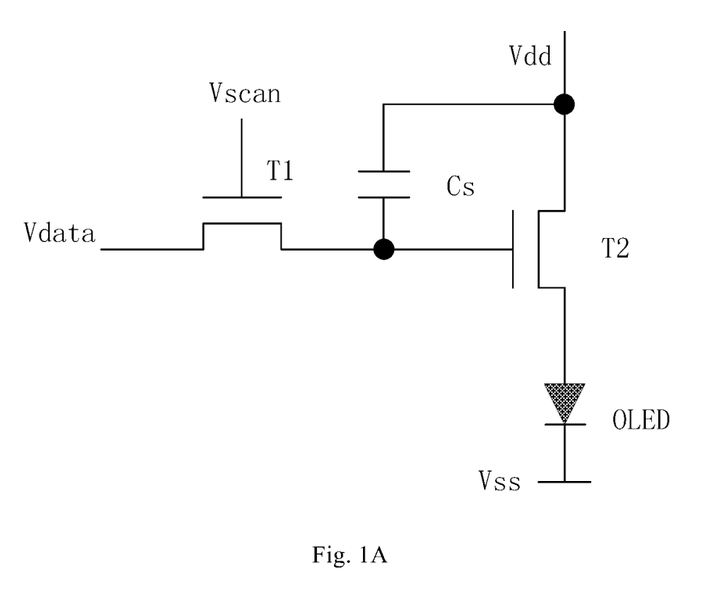
FIGS. 1A-1B are schematic diagrams of two 2T1C pixel circuits in related art.

As shown in FIG. 1A, the 2T1C pixel circuit may include a switching transistor T1, a driving transistor T2, and a storage capacitor Cs. In one embodiment, the switching transistor T1 and the driving transistor T2 are both N-type TFTs. A gate of the switching transistor T1 is coupled to a gate line (scanning line) to receive a scan signal (Vscan), a first terminal of the switching transistor T1 is coupled to a gate of the driving transistor T2, and a second terminal of the switching transistor T1 is coupled to a data line to receive a data signal (Vdata). A first terminal of the driving transistor T2 is coupled to a positive terminal of the OLED, and a second terminal of the driving transistor T2 is coupled to a first power terminal (Vdd, high voltage terminal). One electrode of the storage capacitor Cs is coupled to the first terminal of the switching transistor T1 and the gate of the driving transistor T2, the other electrode of the storage capacitor Cs is coupled to the second terminal of the driving transistor T2 and the first power terminal. The cathode of the OLED is coupled to the second power terminal (Vss, low voltage terminal), for example, to ground. The driving method of the 2T1C pixel circuit is to control the brightness and darkness (grayscale) of the pixel via the two TFTs and the storage capacitor Cs. When a scan signal Vscan is applied through the gate line to turn on the switching transistor T1, the data driving circuit uses a data voltage (Vdata) fed through the data line through the switching transistor T1 to charge the storage capacitor Cs, thereby storing the data voltage in the storage capacitor Cs. The stored data voltage controls the degree of conduction of the driving transistor T2, thereby controlling magnitude of the current flowing through the driving transistor T2 to drive the OLED to emit light. That is, the current determines the gray level of the pixel illumination.

Figure 1B:
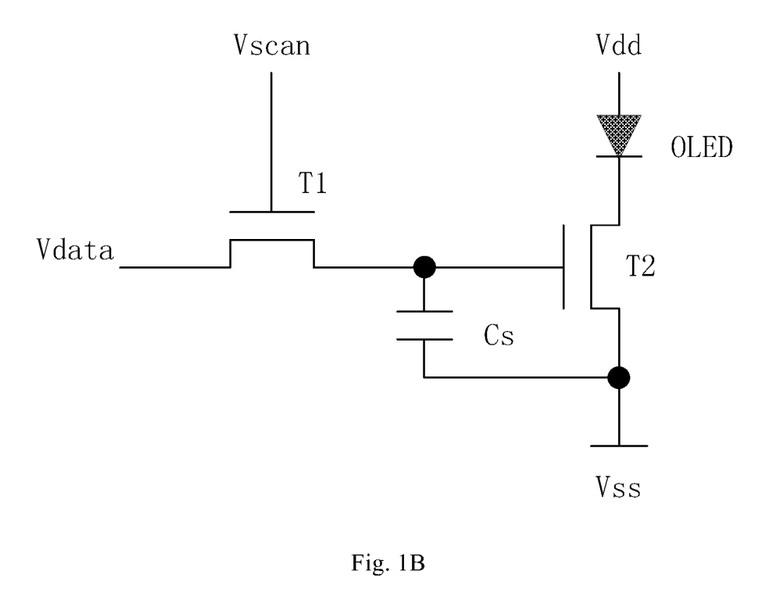

As shown in FIG. 1B, another 2T1C pixel circuit includes a switching transistor T1, a driving transistor T2, and a storage capacitor Cs, but the connection manner thereof is slightly changed. More specifically, the difference of the pixel circuit of FIG. 1B with respect to FIG. 1A includes: the positive terminal of the OLED is coupled to the first power terminal (Vdd, high voltage terminal) and the negative terminal of the OLED is coupled to the second terminal of the driving transistor T2. Furthermore, the first terminal of the driving transistor T2 is coupled to the second power supply terminal (Vss, low voltage terminal), such as ground. One electrode of the storage capacitor Cs is coupled to the first terminal of the switching transistor T1 and the gate of the driving transistor T2, and the other electrode of the storage capacitor Cs is coupled to the source of the driving transistor T2 and the second power supply terminal. The operational mode of the 2T1C pixel circuit is basically the same as that of the pixel circuit shown in FIG. 1A, and the details thereof are not described herein again.

In the OLED display panel, the driving transistors in the respective pixel units may have different threshold voltages due to the difference in real-time temperatures. For example, a thin film transistor using an oxide semiconductor material as a channel material is liable to cause fluctuations in the threshold voltage due to temperature change. For example, the pixel units at different positions may have different real-time temperatures due to different lighting time and lighting intensity. Since the ambient temperatures of the driving transistors in the pixel units at different positions on the display panel may be different, the threshold voltages of the driving transistors in the respective pixel units may be different. Fluctuation in the threshold voltages of the respective driving transistors may cause the display panel to display unevenly.

For example, for a display panel using an N-type TFT as a driving transistor, if a threshold voltage of the N-type TFT exhibits a negative drift, the N-type TFT cannot be completely turned off by the OFF state signal. As a result, the driving current still passes through the driven OLED and causes the OLED to emit light slightly, thereby causing the black screen to illuminate and affecting the contrast of the display panel.

In order to improve display uniformity of the entire panel, it is necessary to compensate for the threshold drift of the driving transistors in the pixel units. The compensation function can be realized by voltage compensation, current compensation or hybrid compensation. Alternatively, for the pixel circuit, the compensation function can be realized by internal compensation, external compensation, and the like. For the internal compensation, the pixel circuit is designed to enable the pixel circuit itself to implement the compensation function. For the external compensation, an external detection circuit is added to the pixel circuit to detect the degree of threshold voltage drift of the driving transistor and then modify the data voltage applied in the display process based on the detected threshold voltage drift, thereby eliminating the effect of the threshold voltage drift of the drive transistor on the driving current and enabling the display panel to achieve better brightness uniformity. The current external compensation technology directly detects threshold voltage drift of the driving transistor to obtain the compensation value of the threshold voltage, thereby increasing significantly complexity of the pixel circuit on the array substrate and difficulty of wiring.

One embodiment of the present disclosure provides a display panel. In the display panel, a second transistor is disposed in a second substrate opposite a first substrate where a driving transistor is located. The second transistor corresponds to the driving transistor. A threshold voltage value of the driving transistor may be compensated through detection of a threshold voltage of the second transistor. As a result, the complexity of the pixel circuit and the wiring density are effectively reduced.

Figure 2:
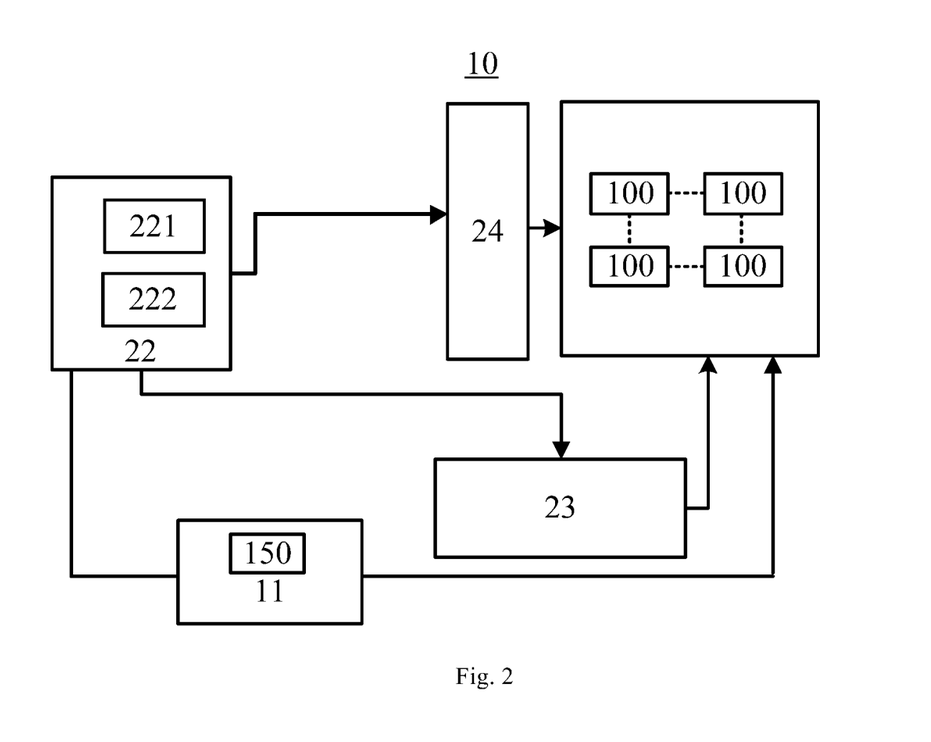
FIG. 2 is a block diagram of a display panel according to one embodiment of the present disclosure.
Figure 3:
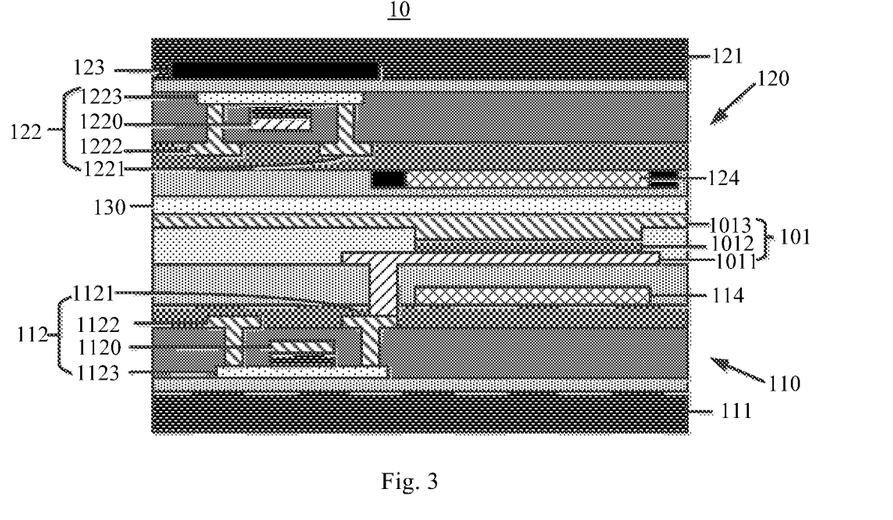
FIG. 3 is a schematic cross-sectional view of a display panel according to one embodiment of the present disclosure.

FIG. 2 is a block diagram of a display panel provided according to one embodiment of the present disclosure, and FIG. 3 is a schematic partial cross-sectional view of the display panel of FIG. 2. For the sake of clarity, only a portion of one pixel unit is shown in FIG. 3. As shown FIG. 2 and FIG. 3, the display panel 10 includes a plurality of pixel units 100, each of which includes a light emitting element 101 and a pixel circuit that drives the light-emitting element 101 to emit light.

In one embodiment, the display panel is an organic light emitting diode (OLED) display panel, and the light-emitting element is an OLED. In one embodiment, the pixel circuit includes the above 2T1C or an OLED pixel circuit which has a compensation function, a reset function, and the like.

In one embodiment, as shown in FIG. 3, the display panel 10 includes a first substrate 110 and a second substrate 120 disposed opposite each other. The first substrate 110 and the second substrate 120 are connected to each other by, for example, an adhesive layer 130. The first substrate 110 includes a first base substrate 111 and a pixel unit 100 disposed on the first base substrate 111. In one embodiment, each pixel unit 100 includes a light emitting element 101 and a first transistor 112 that is directly electrically coupled to the light emitting element 101. The first transistor 112 is a driving transistor in the pixel unit 100, and is configured to operate in a saturated state and control the magnitude of the current that drives the light-emitting element 101 to emit light. In another embodiment, a transistor directly coupled to the light-emitting element 101 may also be a light-emitting control transistor, which is further coupled to the driving transistor for controlling whether a current for driving the light-emitting element 101 to 4 emit light flows. In this embodiment, the driving transistor, which is the first transistor in the embodiment of the present disclosure, is an object of compensation. Hereinafter, the first transistor 112 will be described as a driving transistor in the pixel unit 100 as an example.

In one embodiment, the display panel 10 may further include a data driving circuit 23 and a scan driving circuit 24. The data driving circuit 23 is configured to emit a data signal as needed (e.g., an image signal input to the display apparatus). Each pixel unit of the pixel circuit may be further configured to receive the data signal and apply the data signal to the gate of the first transistor. The scan driving circuit 24 is configured to output various scan signals such as the first scan signal SCN1 and the second scan signal SCN2, which will be described below. The scan driving circuit 24 may be a gate drive circuit (GOA) on an integrated circuit chip or directly formed on the display substrate.

In one embodiment, the display panel 10 further includes a control circuit 22 configured to perform a driving method according to one embodiment of the present disclosure to compensate a threshold voltage of a driving transistor of each pixel unit. For example, the control circuit 22 may be configured to control the data driving circuit 23 to apply a data signal and control the gate drive circuit 24 to apply a scan signal. In one embodiment, the control circuit 22 is a timing control circuit (T-con).

In one embodiment, the first substrate 110 includes a first base substrate 111 and a pixel unit 100 disposed on the first base substrate 111. For the sake of clarity, only a portion of one pixel unit is shown FIG. 3. As shown in FIG. 3, each pixel unit 100 includes a light emitting element 101 and a first transistor 112 for driving the light-emitting element 101 to emit light. That is, the first transistor 112 is a driving transistor in the pixel unit 100. The first transistor 112 is disposed between the first base substrate 111 and the light emitting element 101 and is electrically coupled to the light-emitting element 101. The light emitting element 101 includes a first electrode 1011, a second electrode 1013, and a light emitting layer 1012 disposed between the first electrode 1011 and the second electrode 1013. The first transistor 112 includes a gate 1120, a first terminal 1121, a second terminal 1122, and an active layer 1123. The first electrode 1011 of the light-emitting element 101 is electrically coupled to the first terminal 1121 of the first transistor 112. For example, the first terminal 1121 is a source or drain of the first transistor 112.

The embodiments of the present disclosure do not limit the type, material, and structure of the light-emitting element 101. For example, the light-emitting element 101 may be a top emission type, a bottom emission type, a double-sided emission type, or the like. The light-emitting element 10 may include a hole injection layer, a hole transport layer, an electron injection layer, an electron transport layer and the like in addition to the light-emitting layer 1012. The light-emitting layer may include a polymeric light-emitting material or a small molecule light-emitting material.

The embodiments of the present disclosure do not limit the type, material, and structure of the first transistor 112. For example, the first transistor 112 may be a top gate type, a bottom gate type, or the like, and the active layer may be made of amorphous silicon, polycrystalline silicon (low temperature polycrystalline silicon and high temperature polycrystalline silicon), oxide semiconductor or the like. The first transistor 112 may be an N-type or a P-type.

In one embodiment, the second substrate 120 includes a second base substrate 121 and a second transistor 122 disposed on the second base substrate 121. The second transistor 122 is disposed corresponding to the first transistor 112. In one embodiment, the second transistor 122 is located in the same pixel region as the first transistor. Furthermore, the second transistor and the first transistor 112 substantially overlap or coincide with each other in a direction perpendicular to the panel surface of the display panel (i.e., the orthographic projection of the second transistor 122 on the first substrate 111 and the orthographic projection of the first transistor 112 on the first substrate 111 substantially overlap each other). The term "substantially" herein means that at least about 90%, preferably at least about 95%, more preferably at least about 98% of the orthographic projection of the second transistor on the first substrate overlaps with the orthographic projection of the first transistor on the first substrate. As such, the second transistor 122 has nearly the same real-time ambient temperature as the first transistor 112. In one embodiment, as shown in FIG. 3, the second transistor 122 includes a gate 1220, a first terminal 1221, a second terminal 1222, and an active layer 1223.

The embodiments of the present disclosure do not limit the type, material, and structure of the second transistor 122 except for corresponding to the first transistor 112. For example, the second transistor 122 may be a top gate type, a bottom gate type, or the like. The active layer may be amorphous silicon, polycrystalline silicon (low temperature polycrystalline silicon or high temperature polycrystalline silicon), oxide semiconductor, etc. The second transistor 122 may be a N-type or a P-type.

In one embodiment, the first base substrate 111 and the second base substrate 121 are, for example, transparent substrates such as a plastic substrate or a glass substrate.

In one embodiment, the threshold voltage characteristic of the first transistor 112 corresponds to the threshold voltage characteristic of the second transistor 122. That is, the threshold voltage characteristic of the first transistor 112 is proportional to or has a specific relationship with the threshold voltage characteristic of the second transistor 122. As such, the display panel 10 is configured to compensate the threshold voltage of the first transistor 112 through detecting the threshold voltage of the second transistor 122.

In one embodiment, the first transistor 112 has the same temperature-threshold voltage characteristic as the second transistor 122. That is, the temperature has the same effect on the threshold voltage of the second transistor 122 and that of the first transistor 112. That is, the threshold voltage of the second transistor 122 and that of the first transistor 112 have the same drifting value and the same compensation value at a real-time temperature. In this case, the compensation value of the threshold voltage of the second transistor 122 can be measured as the threshold voltage compensation value of the first transistor 112. As a result, the threshold voltage of the first transistor 112 can be compensated by detecting the threshold voltage of the second transistor 122.

In one embodiment, the first transistor 112 is the same as the second transistor 122. That is, both the first transistor 112 and the second transistor 122 have the same structure and material. In one embodiment, the active layers of the first transistor and the second transistor have the same size and the same material. In one embodiment, in the case where the active layer has a doped region, the doped regions of the active layers of the first transistor and the second transistor have the same size and doping concentration. In one embodiment, the channel regions of the active layers of the first transistor and the second transistor have the same aspect ratio and the like.

In one embodiment, the first transistor 112 and the second transistor 122 are both thin film transistors.

In one embodiment, both the first transistor 112 and the second transistor 122 are either a top gate structure or a bottom gate structure.

In one embodiment, both the active layer 1123 of the first transistor 112 and the active layer 1223 of the second transistor 122 include a metal oxide semiconductor material, such as indium gallium zinc oxide (IGZO), indium zinc oxide (IZO), aluminum zinc oxide (AZO), or zinc oxide (ZnO), etc. In one embodiment, the composition ratio of three elements, indium, gallium, and zinc in indium gallium zinc oxide is 1:1:4.

In one embodiment, the first transistor 112 has a similar temperature-threshold voltage characteristic curve as the second transistor 122. For example, the first drift value of the threshold voltage of the first transistor 112 caused by the temperature is proportional to or in a certain relationship with the second drift value of the threshold voltage of the second transistor 122 caused by the temperature. In this case, the drift value and the compensation value of the first threshold voltage of the first transistor 112 can be inferred based on the measured drift value and the compensation value of the second threshold voltage of the second transistor 122. As such, the first threshold voltage of the first transistor 112 can be compensated by detecting the second threshold value of the second transistor 122.

In one embodiment, the second substrate 120 includes a plurality of second transistors 122, and the plurality of second transistors 122 are in one-to-one correspondence with the plurality of first transistors 112 of the plurality of pixel units 100 in the first substrate. As such, the first transistors 112 may have closer positional relationship with the corresponding second transistors 122 respectively, thereby being in a more real-time temperature environment. In this case, the threshold voltages of the second transistors 122 are detected in order to compensate the threshold voltages of the corresponding first transistors 112 respectively.

In one embodiment, the second substrate 120 is divided into a plurality of regions, each of which corresponds to a plurality of pixel units 100. Each region is provided with a second transistor 122. The second transistor corresponds to the plurality of pixel units 100 corresponding to the region. That is, the second transistor 122 also corresponds to the plurality of first transistors 112 of the plurality of pixel units 100 in the corresponding region. As such, the distribution density of the second transistors 122 can be reduced. In one embodiment, the second substrate 120 may be divided into a plurality of regions according to pixels, and one pixel includes, for example, three or more pixel units 100 to cooperate to emit light of a certain color. The plurality of pixel units in one pixel is relatively close in terms of not only the positional relationship, but also the luminescence time. As such, the first transistors 112 of the plurality of pixel units 100 in one pixel are in a nearly same real-time temperature environment. In this case, a second transistor may be disposed corresponding to the plurality of pixel units 100 in one pixel. That is, one second transistor corresponds to a plurality of first transistors 112 in a plurality of pixel units 100.

In one embodiment, one pixel includes three pixel units 100 (for example, RGB). One second transistor 122 may be disposed corresponding to three pixel units 100 in one pixel. That is, one second transistor 122 corresponds to three first transistors 112. In one embodiment, one pixel includes four pixel units 100 (for example, RGBW). One second transistor 122 may be disposed corresponding to four pixel units 100 in one pixel. That is, one second transistor 122 corresponds to four first transistors 112. In this case, by detecting the threshold voltage of the second transistor 122, the threshold voltages of the plurality of corresponding first transistors 112 can be compensated.

In one embodiment, the second substrate 120 further includes a detection circuit 11 electrically coupled to the second transistor 122 to detect the threshold voltage of the second transistor 122 in real time.

Figure 4:
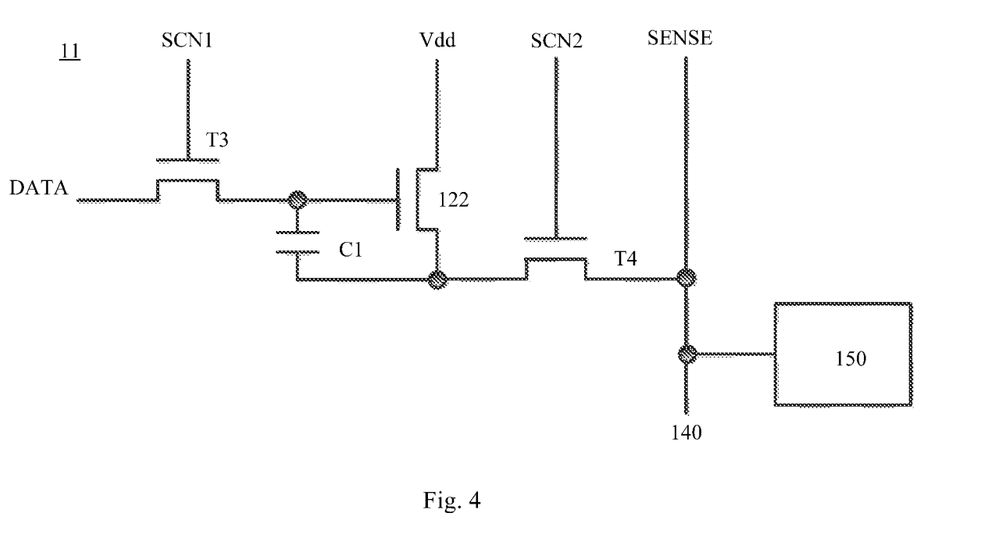
FIG. 4 is a schematic diagram of a detection circuit provided according to one embodiment of the present disclosure.

FIG. 4 shows a structure of a detection circuit according to one embodiment of the present disclosure. As shown in FIG. 4, the detection circuit 11 includes a third transistor T3, a fourth transistor T4, a first capacitor C1, and a detection line 140. The gate and the first terminal of the third transistor T3 are configured to respectively receive the first scan signal SCN1 and the data signal DATA, and the second terminal of the third transistor T3 is coupled to the gate of the second transistor 122. The first and second terminals of the second transistor 122 are respectively coupled to the first power voltage Vdd and the first terminal of the fourth transistor T4. The gate of the fourth transistor T4 is configured to receive the second scan signal SCN2, and the second terminal of the fourth transistor is coupled to the detection line 140 for receiving the detection signal SENSE. The first capacitor C1 is coupled between the gate and the second terminal of the second transistor 122. The first scan signal SCN1, the second scan signal SCN2, and the data signal DATA are provided by the corresponding gate lines and data lines disposed on the second substrate. The corresponding gate lines and data lines disposed on the second substrate are, for example, electrically coupled to the separately provided gate driving circuit and data driving circuit. The gate driving circuit and the data driving circuit may be disposed on the second substrate. Alternatively, the gate driving circuit and the data driving circuit may be disposed on the first substrate and are coupled to the gate lines and the data lines on the second substrate through a conductive path (for example, an anisotropic conductive paste) disposed between the first substrate and the second substrates. For example, the data signal DATA supplied to the detecting circuit may be a specific reference data signal for detection such as a stable voltage signal. As such, a data driving circuit may not be needed, and a voltage terminal or a circuit that outputs the stable voltage signal may be used instead.

In one embodiment, the detection line 140 is coupled to a sampling circuit 150 to sample electrical signals on the detection line 140. The sampling circuit may be, for example, a conventional sampling circuit including an amplifier and an analog-to-digital converter (ADC), etc., which is not described in detail in the embodiments of the present disclosure.

In the following, the detection method of the detection circuit is exemplified by taking the second transistor 122, the third transistor T3, and the fourth transistor T4 as N-type transistors for an example. However, the embodiment of the present disclosure does not limit this.

In one embodiment, the detection method includes: at a first moment, both the first scan signal SCN1 and the second scan signal SCN2 provide an on signal and a data signal DATA and a detection signal SENSE are also provided. In this case, the third transistor T3 and the fourth transistor T4 are both turned on. As such, the data signal DATA is transmitted to the gate of the second transistor 122 and the first electrode of the first capacitor C1 via the third transistor T3. The detection signal SENSE passes through the fourth transistor T4 and is transmitted to the second terminal of the second transistor 122 and the second electrode of the first capacitor C1. Under the action of the first power voltage Vdd, a driving current is generated in the second transistor 122 and charges the second electrode of the first capacitor C1 to Vdata-Vth, wherein Vth is the threshold voltage of the second transistor 122. At this time, the second transistor 122 is turned from the on state to the off state. At the second moment, the first scan signal SCN1 and the second scan signal SCN2 both provide an on signal, and the third transistor T3 and the fourth transistor T4 are both turned on. The second electrode of the capacitor C1 is sampled by the sampling circuit 150 to obtain the threshold voltage Vth of the second transistor 122.

In one embodiment, as shown in FIG. 3, the second substrate 120 further includes a light shielding layer 123. The second transistor 122 is located in a region where the light shielding layer 122 is located or covered, so that the second transistor 122 is protected by the light shielding layer 123 from ambient light outside the display panel, thereby avoiding the adverse effects of the ambient light on the detection result. In one embodiment, the orthographic projection of the second transistor 122 on the second base substrate 121 falls within the orthographic projection of the light-shielding layer 123 on the second base substrate 121. In one embodiment, the light-shielding layer 123 is made of an opaque metal material such as copper, aluminum, or magnesium, or a metal alloy material, or a black resin.

In one embodiment, the light-emitting element 101 is a double-sided light-emitting structure, and the first electrode 1011 and the second electrode 1013 of the light-emitting element 101 are made of both light transmissive or semi-transmissive materials. As such, the display panel 10 forms a double-sided display structure. In one embodiment, the first electrode 1011 is made of a transparent metal oxide conductive material having a high work function, such as indium tin oxide (ITO) or the like. The second electrode 1023 has, for example, a laminated structure of a metal material and a transparent metal oxide material such as an Ag/ITO laminate structure.

In one embodiment, as shown in FIG. 3, the light emitting element 101 is a double-sided light emitting structure. The first substrate 110 and the second substrate 120 respectively include a first color filter layer 114 and a second color filter layer 124. The first color filter layer 114 is disposed between the first transistor 112 and the light emitting element 101, and the second color filter layer 124 is disposed between the second transistor 122 and the light-emitting element 101. The orthogonal projection of the first color filter layer 114 and that of the second color filter layer on the first base substrate 111 respectively substantially overlap with the orthographic projection of the light-emitting element 101 on the first base substrate 111.

In one embodiment, in the second substrate 120, between the filter units of different colors of the second color filter layer 124, a black matrix structure is further provided for preventing light leakage and color separation. The first substrate 110 can also be similarly arranged, and details are not described herein again. The black matrix can be prepared from a metal oxide or a black resin by a photolithography process, or the like.

In one embodiment, the light-emitting element 101 may also be a top light-emitting structure or a bottom light-emitting structure. In this case, a filter layer may be respectively disposed in the second substrate 120 or the first substrate 110, and the details thereof are not described herein again.

In one embodiment, the control circuit 22 is further configured to perform the above-described detection method to detect the threshold voltage of the second transistor 122 of each pixel unit in real time. For example, the control circuit 22 is configured to control the detection circuit 11 to detect the threshold voltage of the second transistor 122 in real time.

Another example of the present disclosure further provides a driving method of the display panel 10 described above. The driving method may include: compensating a threshold voltage of the first transistor 121 by detecting a threshold voltage of the second transistor 122. As described above, the above-described driving method is made possible because the threshold voltage characteristic of the first transistor 112 corresponds to the threshold voltage characteristic of the second transistor 122. That is, the threshold voltage characteristic of the first transistor 112 is proportional to or has a specific relationship with the threshold voltage characteristic of the second transistor 122.

In one embodiment, the drift value (compensation value) of the first threshold voltage of the first transistor 112 caused by a certain temperature is proportional to or has a specific relationship with the drift value (compensation value) of the second threshold voltage of the second transistor 122 caused by the certain temperature. The driving method includes: establishing a correspondence relationship between a threshold voltage compensation value of the second transistor 122 and a threshold voltage compensation value of the first transistor 112, and using the correspondence relationship and the detected threshold voltage of the second transistor to compensate the threshold voltage of the first transistor 112. In one embodiment, the compensation value of the threshold voltage of the second transistor can be obtained by detecting the real-time threshold voltage value of the second transistor 122 and a standard value of the threshold voltage of the second transistor 122 (for example, a standard threshold voltage value under room temperature condition). Because the ambient temperature of the first transistor 112 and that of the second transistor 122 are nearly the same, the threshold voltage compensation value of the first transistor 112 can be inferred based on the correspondence relationship between the threshold voltage compensation value of the second transistor 122 and the threshold voltage compensation value of the first transistor 112. Then, the threshold value of first transistor 112 is compensated based on the threshold voltage compensation value of the first transistor 112.

In one embodiment, the driving method further includes performing threshold compensation of the first transistor 112 by an external compensation circuit. The resulting threshold voltage compensation value of the first transistor 112 may be stored in the control circuit 22 in a lookup table.

In one embodiment, the first transistor 112 and the second transistor 122 have the same temperature-threshold voltage characteristic curve. In this case, since the ambient temperatures of the first transistor 112 and the second transistor 122 are nearly the same, the threshold voltage compensation value of the second transistor 122 can be regarded as the threshold voltage compensation value of the first transistor 111.

In one embodiment, the driving method includes acquiring a real-time temperature by detecting a threshold voltage of the second transistor 122, and compensating for a threshold voltage of the first transistor 112 based on the real-time temperature.

In one embodiment, the driving method includes: acquiring a temperature-threshold voltage relationship curve of the second transistor 122; obtaining a real-time temperature by detecting a threshold voltage of the second transistor 122 in connection with the temperature-threshold voltage relationship curve of the second transistor 122; obtaining a temperature-threshold voltage relationship curve of the first transistor 112; and obtaining the threshold voltage compensation value of the first transistor 112 by using the temperature-threshold voltage relationship curve of the first transistor 112 and the real-time temperature.

In one embodiment, the temperature-threshold voltage characteristic curves of the first transistor 112 and the second transistor 122 may be respectively measured before the first substrate 110 and the second substrate 120 are bonded to each other.

Figure 5:
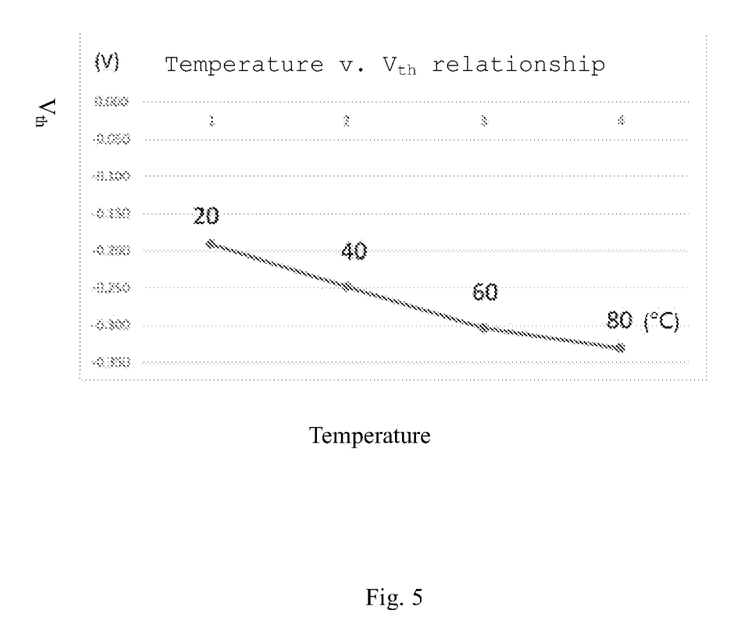
FIG. 5 shows an example of a temperature-threshold voltage characteristic curve of a second transistor according to one embodiment of the present disclosure.

FIG. 5 shows an example of a temperature-threshold voltage characteristic curve of the second transistor 122 according to one embodiment of the present disclosure. As shown in FIG. 5, the temperature-threshold voltage characteristic curve of the second transistor 122 is obtained by detecting the threshold voltages of the second transistor 122 at four different temperatures, that is, 20° C., 40° C., 60° C., and 80° C.

In one embodiment, since the threshold voltage has a one-to-one correspondence with the temperature, after the detection circuit 11 detects the real-time threshold voltage of the second transistor 122, the real-time temperature T of the second transistor 122 is obtained by consulting with the temperature-threshold voltage characteristic curve. Then, using the real-time temperature T in consultation with the temperature-threshold voltage characteristic curve of the first transistor 112, a real-time threshold voltage of the first transistor 112 is determined. Then, the threshold voltage compensation value is obtained by comparing the real-time threshold voltage of the first transistor 112 with the standard value of the threshold voltage of the first transistor 112 (such as a threshold voltage value at a room temperature).

In one embodiment, the control circuit 22 is also configured to perform the driving method provided by embodiments of the present disclosure to compensate for the threshold voltage of first transistor 112 of each pixel unit. For example, the control circuit 22 is configured to control the external compensation circuit to compensate for the threshold voltage of first transistor 112.

In one embodiment, the control circuit 22 can be in various forms. In one embodiment, the control circuit includes a processor 221 and a memory 222. The memory 222 includes executable code and the processor 221 can run the executable code to perform the detection method described above.

In one embodiment, the processor 221 can be a central processing unit (CPU) or other form of processing device having data processing capabilities and/or instruction execution capabilities such as a microprocessor, programmable logic controller (PLC), or the like.

In one embodiment, the memory 222 can include one or more computer program products, which can include various forms of computer readable storage media such as volatile memory and/or nonvolatile memory. Volatile memory can include, for example, random access memory (RAM) and/or caches and the like. The non-volatile memory may include, for example, a read only memory (ROM), a hard disk, a flash memory, or the like. One or more computer program instructions can be stored on a computer readable storage medium, and processor 221 can execute the functions desired by the program instructions. Various applications and various data such as threshold voltage compensation value data acquired in the above-described detection method, and the like can also be stored in the computer readable storage medium.

Figure 6A:
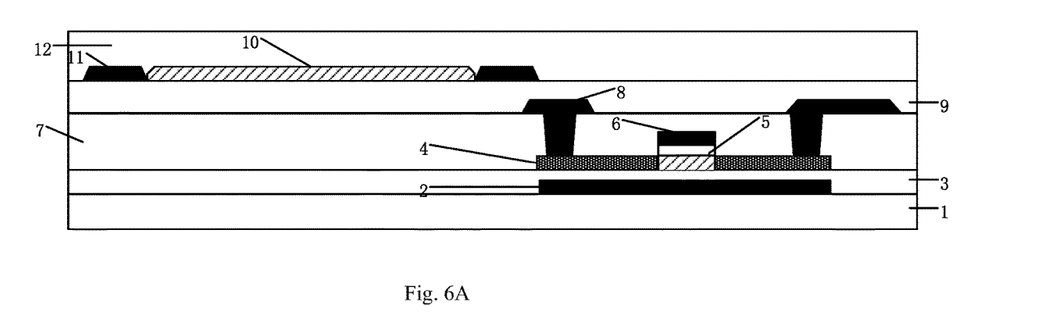
FIG. 6A shows a schematic structure of a second substrate according to one embodiment of the present disclosure.
Figure 6B:
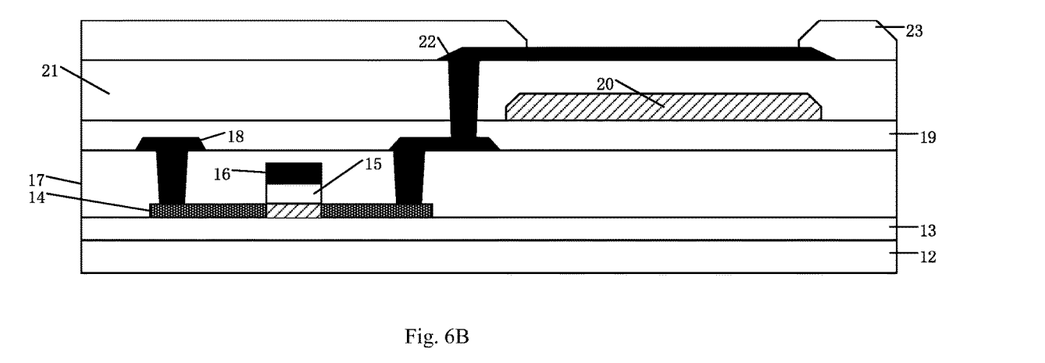
FIG. 6B shows a schematic structure of a first substrate according to one embodiment of the present disclosure.

Another example of the present disclosure provides a method of forming the display panel according to one embodiment of present disclosure. The laminated structure of the display panel prepared in this embodiment may include a transparent substrate layer, a light shielding layer, a buffer layer, a semiconductor layer, a gate insulating layer, an intermediate dielectric layer, a source and drain layer, and a passivation layer. In one embodiment, the method may include forming a second substrate having a structure as shown in FIG. 6A and forming a first substrate having a structure as shown in FIG. 6B separately. As shown in FIG. 6A, the second substrate may include a glass substrate 1 as a transparent base substrate, a light shielding layer 2, a buffer layer 3, a semiconductor layer 4, a gate insulating layer 6, an intermediate dielectric layer 7, a source and drain layer 8, a passivation layer 9, a color filter 10, a black matric 11, and OC 12. As shown in FIG. 6B, the first substrate may include a glass layer 12, a buffer layer 13, a semiconductor layer 14, a gate insulating layer 16, an intermediate dielectric layer 17, a source and drain layer 18, a passivation layer 19, a color filter 20, a resin layer 21, an anode 22, and a pixel defining layer 23.

Figure 6C:
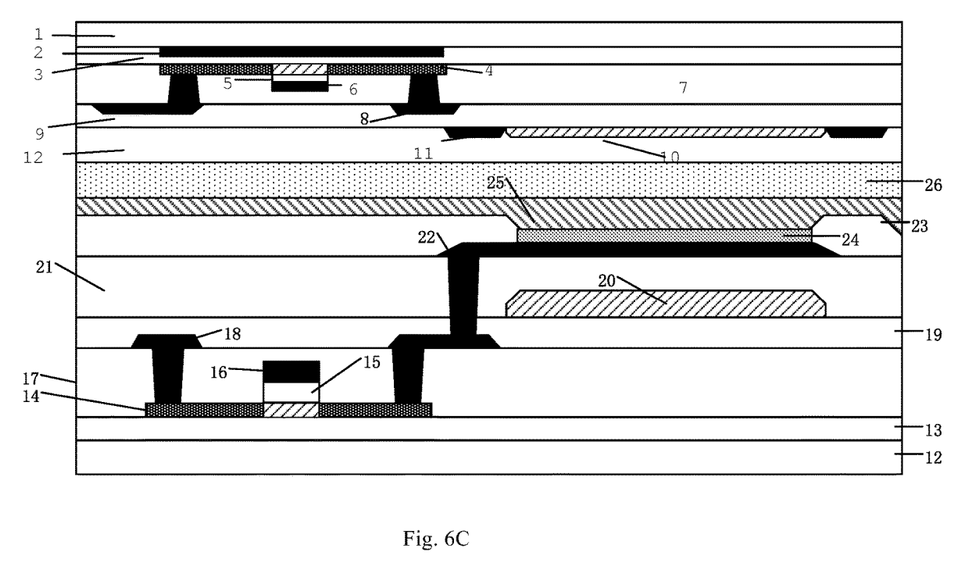
FIG. 6C shows a schematic structure of a display panel according to one embodiment of the present disclosure.

Then, the first substrate and the second substrate are aligned and combined to form the display panel having a structure as shown in FIG. 6C. As shown in FIG. 6C, an emission layer 24, a cathode layer 25, and a filler layer 26 are also formed between the first substrate and the second substrate.

Some embodiments of the present disclosure provide a display panel, a manufacturing method thereof, and a driving method thereof. By setting a second transistor corresponding to a driving transistor in a pixel unit, and compensating for a threshold voltage of the driving transistor by detecting a threshold voltage of the second transistor, the complexity of the pixel circuit and the wiring density can be effectively reduced.

The principle and the embodiment of the present disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. A display panel, comprising:
    a first substrate, the first substrate comprising a pixel unit, the pixel unit comprising a light emitting element and a first transistor for driving the light emitting element to emit light;
    a second substrate opposite the first substrate, the second substrate comprising a second transistor,
    wherein the second transistor is configured to have a second drift value of a second threshold voltage which has a specific relationship with a first drift value of a first threshold voltage of the first transistor under same ambient condition.

2. The display panel according to claim 1, wherein the first drift value of the first threshold voltage of the first transistor caused by a temperature is substantially the same as the second drift value of the second threshold voltage of the second transistor caused by the temperature.

3. The display panel according to claim 1, wherein the second transistor is substantially identical in structure and material as the first transistor, and the specific relationship is that the second drift value is proportional to the first drift value.

4. The display panel according to claim 1, wherein active layers of the first transistor and the second transistor have the same size and are made of the same material, and the specific relationship is that the second drift value is the same as the first drift value.

5. The display panel according to claim 4, wherein doped regions of the active layers of the first transistor and the second transistor have the same size and doping concentration.

6. The display panel according to claim 4, wherein channel regions of the active layers of the first transistor and the second transistor have the same aspect ratio.

7. The display panel according to claim 1, wherein an orthographic projection of the second transistor on the first substrate substantially overlaps an orthographic projection of the first transistor on the first substrate.

8. The display panel according to claim 1, wherein the pixel unit comprises a plurality of pixel units, the plurality of pixel units comprising a plurality of first transistors,
    the second substrate comprises a plurality of second transistors, and the plurality of second transistors are in one-to-one correspondence with the plurality of first transistors.

9. The display panel according to claim 1, wherein the pixel unit comprises a plurality of pixel units, the plurality of pixel units comprising a plurality of first transistors,
    the second substrate comprises a plurality of second transistors, and each of the plurality of second transistors corresponds to two or more of the plurality of first transistors.

10. The display panel according to claim 1, wherein the second substrate further comprises a detection circuit coupled to the second transistor, and the detection circuit is configured to detect the second threshold voltage of the second transistor.

11. The display panel according to claim 10, wherein the detecting circuit comprises a third transistor, a fourth transistor, and a first capacitor;
a gate and, a first terminal of the third, transistor are configured to respectively receive a first scan signal and a data signal, and a second terminal of the third transistor is coupled to a gate of the second transistor;
a first terminal and a second terminal of the second transistor are respectively coupled to a first power voltage and a first terminal of the fourth transistor;
a gate and a second terminal of the fourth transistor are respectively configured to receive a second scan signal and a detection signal respectively; and
the first capacitor is coupled between the gate and the second terminal of the second transistor.

12. The display panel according to claim 1, wherein the second substrate further comprises a light shielding layer, and the light shielding layer is configured to shield the second transistor from external ambient light.

13. The display panel according to claim 1, wherein the first substrate and the second substrate respectively comprise a first color filter layer and a second color filter layer; the first color filter layer is in an area between first black matrix covering the first transistor; and the second color filter layer is in an area between second black matrix covering the second transistor.

14. The display panel according to claim 13, wherein an orthogonal projection of the first color filter layer and that of the second color filter layer on a first base substrate respectively substantially overlap with an orthographic projection of the light-emitting element on the first base substrate.

15. The display panel according to claim 1, wherein the display panel is an organic light emitting diode display panel.

16. A method of driving the display panel according to claim 1, comprising:
compensating for the first threshold voltage of the first transistor by detecting the second threshold voltage of the second transistor.

17. The driving method according to claim 16, further comprising:
establishing a specific relationship between a threshold voltage compensation value of the second transistor and a threshold voltage compensation value of the first transistor, and
compensating for the threshold voltage of the first transistor by detecting the threshold voltage of the second transistor comprises:
compensating for the threshold voltage of the first transistor by using the specific relationship and the detected threshold voltage of the second transistor.

18. The driving method according to claim 17, wherein the threshold voltage compensation value of the second transistor is substantially equal to the threshold voltage compensation value of the first transistor.

19. The driving method according to claim 16, further comprising: obtaining a real-time temperature by detecting the threshold voltage of the second transistor, and
compensating for the threshold voltage of the first transistor by detecting the threshold voltage of the second transistor comprises:
compensating for the threshold voltage of the first transistor based on the real-time temperature.

20. The driving method of claim 19, wherein obtaining the real-time temperature by detecting the threshold voltage of the second transistor comprises:
obtaining a temperature-threshold voltage relationship curve of the second transistor, acquiring the real-time temperature by detecting the threshold voltage of the second transistor and consulting with the temperature-threshold voltage relationship curve of the second transistor; and
compensating for the threshold voltage of the first transistor based on the real-time temperature comprises:
obtaining a temperature-threshold voltage relationship curve of the first transistor, and acquiring the threshold voltage compensation value of the first transistor by using the real-time temperature and consulting with the temperature-threshold voltage relationship curve of the first transistor.

* * * * *